United States Patent
Werner

(10) Patent No.: US 6,469,365 B1
(45) Date of Patent: Oct. 22, 2002

(54) SEMICONDUCTOR COMPONENT WITH A STRUCTURE FOR AVOIDING PARALLEL-PATH CURRENTS AND METHOD FOR FABRICATING A SEMICONDUCTOR COMPONENT

(75) Inventor: Wolfgang Werner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/415,728

(22) Filed: Oct. 12, 1999

Related U.S. Application Data

(63) Continuation of application No. PCT/DE99/00214, filed on Jan. 27, 1999.

(51) Int. Cl.$^7$ ........................ H01L 29/00; H01L 27/082; H01L 27/102; H01L 29/70; H01L 31/11
(52) U.S. Cl. ........................ 257/544; 257/545; 257/549; 257/555; 257/591
(58) Field of Search ........................ 257/544, 545, 257/549, 555, 591

(56) References Cited

U.S. PATENT DOCUMENTS

| | | | |
|---|---|---|---|
| 4,038,680 A | * 7/1977 | Yagi et al. | 257/549 |
| 5,124,271 A | 6/1992 | Havemann | 257/549 |
| 5,179,432 A | 1/1993 | Husher | 257/549 |
| 5,283,460 A | * 2/1994 | Mita | 257/432 |
| 5,382,824 A | * 1/1995 | Popovic | 257/464 |
| 5,485,027 A | 1/1996 | Williams et al. | 257/549 |
| 5,899,714 A | * 5/1999 | Farrenkopf et al. | 438/202 |

FOREIGN PATENT DOCUMENTS

| | | | |
|---|---|---|---|
| DE | 4411869 A1 | 10/1995 | 257/549 |
| EP | 0282734 A1 | 9/1988 | 257/549 |
| EP | 0764988 A2 | 3/1997 | 257/549 |
| GB | 2175138 A | 11/1986 | 257/549 |
| JP | 2-2155 | * 1/1990 | 257/549 |
| JP | 2-56935 | * 2/1990 | 257/549 |
| JP | 09213787 | 8/1997 | 257/549 |

* cited by examiner

Primary Examiner—Olik Chaudhuri
Assistant Examiner—Shrinivas H. Rao
(74) Attorney, Agent, or Firm—Laurence A. Greenberg; Werner H. Stemer; Ralph E. Locher

(57) ABSTRACT

A semiconductor component having a structure for avoiding parallel-path currents in the semiconductor component includes a substrate of a first conductivity type having a surface. A plurality of separate wells of a second conductivity type with a more highly doped edge layer of the second conductivity type are disposed at the surface of the substrate and are isolated from one another by pn junctions. At least one of the wells is completely surrounded by an insulating well of the first conductivity type. The doping of the insulating well is higher than that of the substrate. A method for fabricating a semiconductor component is also provided.

5 Claims, 1 Drawing Sheet

SEMICONDUCTOR COMPONENT WITH A STRUCTURE FOR AVOIDING PARALLEL-PATH CURRENTS AND METHOD FOR FABRICATING A SEMICONDUCTOR COMPONENT

CROSS-REFERENCE TO RELATED APPLICATION

This application is a continuation of copending International Application No. PCT/DE99/00214, filed Jan. 27, 1999, which designated the United States.

BACKGROUND OF THE INVENTION

Field of the Invention

The present invention relates to a semiconductor component having a substrate of a first conductivity type with a surface at which a plurality of separate wells of a second conductivity type with a more highly doped edge layer of the second conductivity type are disposed and isolated from one another by pn junctions. The invention also relates to a method for fabricating a semiconductor component.

In integrated power switches produced in a plurality of wells in the surface of a semiconductor, operating states frequently occur in which a potential of a drain electrode of a DMOS transistor becomes negative relative to a substrate potential. In that case, minority carriers (electrons) are injected into the p$^-$-doped substrate from at least one of the wells. Due to the very high carrier lifetime in the substrate, the range of those minority carriers is very high (a few mm). Each further n-type well situated in the crystal acts as a collector or as a drain for those minority carriers. The functioning of the components (pMOS, nMOS, PNPs, NPNs, etc.) situated in the further n-type wells is impaired by those parasitic currents, which can lead to a functional failure of the circuit. The injecting well (emitter), the substrate (base) and each further well (collector) thus form an NPN transistor. The current flowing through that NPN transistor is called "parallel-path current" or "cross current".

German Published, Non-Prosecuted Patent Application DE 44 11 869 A1, corresponding to U.S. Pat. No. 5,719,431, describes a structure in which the parallel-path current is suppressed through the use of two measures. The first measure resides in placing extraction rings around the injecting component, or the component forming the emitter, and connecting them to the source connection of the DMOS transistor. The second measure resides in using a p$^+$-p$^-$-type substrate. The extraction rings act as a collector, so that the further wells are practically no longer able to take up a parallel-path current. As a result of the doping gradient between the p$^+$-type region and the p$^-$-type region in the substrate, a drift field is built up which prevents the injection of the minority carriers into the substrate.

Although that structure has proved to be effective for suppressing parallel-path currents, it does have two not inconsiderable disadvantages. Firstly, the required p$^+$-type or p$^+$-p$^-$-type substrate is more expensive than the p$^-$-type substrate that is used as a standard substrate. Secondly, an existing circuit layout cannot be made parallel-path current proof without far-reaching corrections to the layout: it is necessary to provide the extraction rings. Finally, the extraction rings mean that a larger chip area is required, all the more so since it is necessary to dissipate comparatively large currents which may become greater than the rated current of the component and may be as much as 10 A.

SUMMARY OF THE INVENTION

It is accordingly an object of the invention to provide a semiconductor component with a structure for avoiding parallel-path currents, in which individual wells in the component are not influenced by minority carriers injected into a substrate, as well as a method for fabricating a semiconductor component, which overcome the hereinafore-mentioned disadvantages of the heretofore-known devices and methods of this general type.

With the foregoing and other objects in view there is provided, in accordance with the invention, a semiconductor component, comprising a substrate having a first conductivity type and a surface; a plurality of separate wells of a second conductivity type with a more highly doped edge layer of the second conductivity type disposed at the surface of the substrate and isolated from one other by pn junctions; and an insulating well of the first conductivity type completely surrounding at least one of the separate wells and having a higher doping than the substrate.

The invention prevents minority carriers situated in the substrate from penetrating into the wells in large numbers, or prevents minority carriers from reaching the substrate at all from the wells and, consequently, parallel-path currents from being able to arise.

In this case, the wells surrounded by an insulating well may be inner wells that inject minority carriers or wells that take up minority carriers. By virtue of the fact that the doping of the insulating well is higher than that of the substrate, an opposing field builds up between the substrate and the substrate supplementary layer and prevents the minority carriers from penetrating further into the insulating well.

In accordance with another feature of the invention, the insulating well includes a substrate supplementary layer on the substrate and a side wall between the substrate supplementary layer and the surface of the semiconductor.

In both embodiments, the well is "hermetically" shielded by the insulating well with the substrate supplementary layer and the side wall of the respective first conductivity type in the semiconductor against the rest of the semiconductor. In other words, in particular, it is shielded against the remaining wells in the semiconductor, with the result that parallel-path currents can no longer issue from the shielded well or can no longer reach the latter.

In accordance with a further feature of the invention, there is provided a spacer layer of the first conductivity type between the substrate supplementary layer and the edge layer. The spacer layer is more weakly doped than the substrate supplementary layer or the side wall, thereby ensuring the dielectric strength of the component. In this case, the spacer layer may include two or more partial layers, with the result that the dielectric strength can be set depending on the number of partial layers.

With the objects of the invention in view there is also provided a method for fabricating a semiconductor component, which comprises providing a substrate having a first conductivity type and a surface of the component on the substrate; producing a plurality of separate wells at the surface of the substrate, the separate wells having a second conductivity type and a more highly doped edge layer of the second conductivity type; producing connection and control electrodes in the separate wells for fabricating component structures; and producing an insulating well around at least one of the separate wells, the insulating well having the first conductivity type and a doping higher than the substrate.

In accordance with another mode of the invention, in order to produce the insulating well, a substrate supplementary layer is produced on the substrate and a vertical side wall contiguous with the substrate supplementary layer is produced between the wells.

In accordance with a concomitant mode of the invention, a spacer layer of the first conductivity type is produced between the insulating well and the edge layer and is more weakly doped than the insulating well.

Other features which are considered as characteristic for the invention are set forth in the appended claims.

Although the invention is illustrated and described herein as embodied in a semiconductor component with a structure for avoiding parallel-path currents and a method for fabricating a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
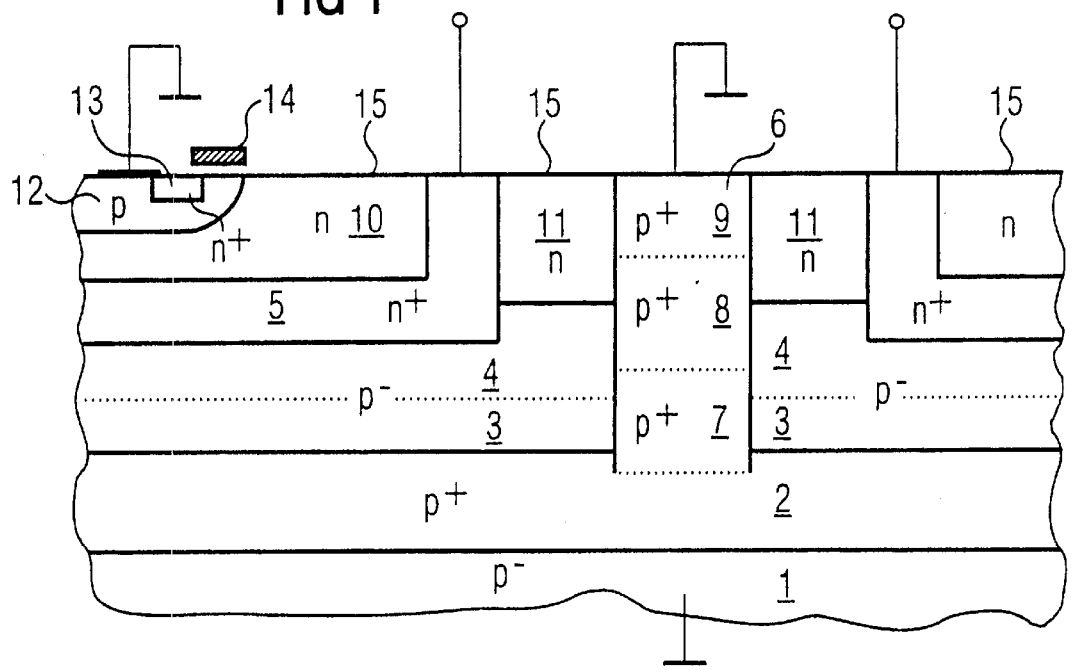
FIG. 1 is a fragmentary, diagrammatic, cross-sectional view of a first embodiment of a semiconductor component constructed according to the invention.

Referring now to the figures of the drawings in detail and first, particularly, to FIG. 1 thereof, there is seen a structure according to the invention which includes a p$^-$-type standard substrate 1 as a starting material that is covered by a plurality of layers in which a plurality of n-doped wells 10 is produced in a surface of a layer structure. One of the wells 10 is shown at a left-hand edge and one of the wells 10 is shown at a right-hand edge in each of FIGS. 1 and 2. The wells serve to accommodate individual semiconductor switch elements, which are indicated as DMOS transistors in FIG. 1 and FIG. 2. In this case, a first diffusion of the DMOS transistor, which is p-doped and defines a channel of the DMOS transistor, is designated by reference numeral 12, a second diffusion of the DMOS transistor, which is n$^+$-doped and acts as a source connection, is designated by reference numeral 13 and a gate electrode of the DMOS transistor is designated by reference numeral 14.

Figure 2:
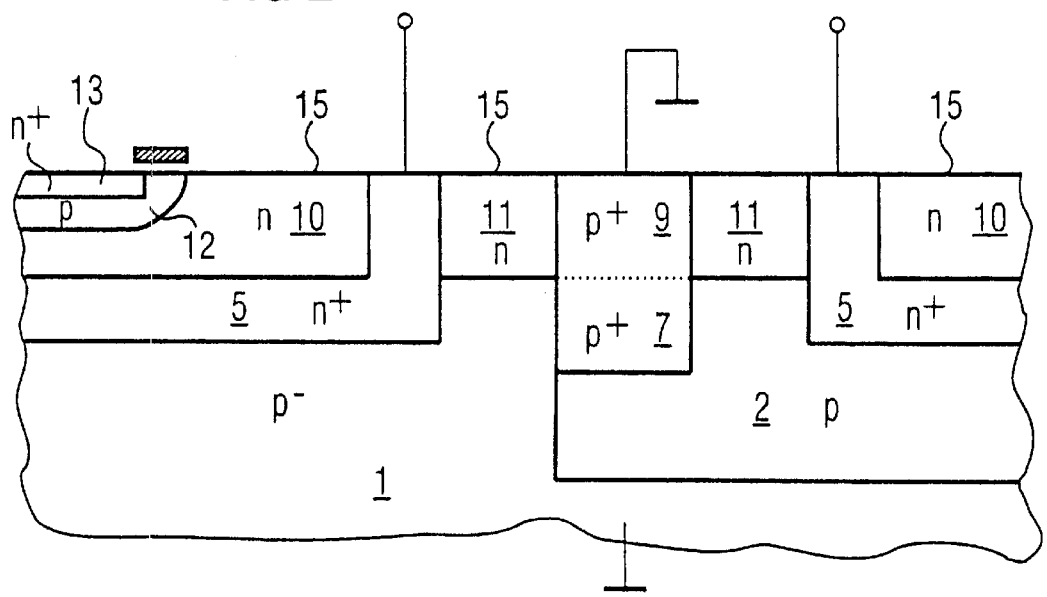
FIG. 2 is a view similar to FIG. 1 of a second embodiment of a semiconductor component according to the invention.

During operation of the DMOS transistor, a situation may arise in which the source electrode is at ground potential and the drain connection of the DMOS transistor is at negative potential. The result of this, as described above, is that electrons as minority carriers drift from the drain connection into the substrate, particularly if the substrate is at ground potential, as is shown in FIGS. 1 and 2.

During the fabrication of the embodiment of the semiconductor switch according to the invention as shown in FIG. 1, the p$^-$-doped substrate 1 is covered over its entire area with a substrate supplementary layer or p$^+$-type diffusion 2. The thickness of the substrate 1 is normally 500 μm, and that of the p$^+$-type diffusion 2 is preferably from 10 to 20 μm.

At least one spacer layer 3 is applied to the p$^+$-type diffusion 2, in particular as an epitaxial layer which is p-doped and has a doping that is thus less than that of the p$^+$-type diffusion 2. The p$^+$-type diffusion 2 serves to produce a doping gradient with the p-type epitaxial layer 3. As a result, (minority) charge carriers which are injected from one of the n-doped wells are prevented from penetrating more deeply into the p$^-$-type substrate and being distributed over a large region, where they may then be extracted with difficulty.

Instead of an epitaxial layer 3 having a small thickness, it is also possible to provide two epitaxial layers 3 and 4 or an epitaxial layer 3 having a larger thickness, if this is required by the dielectric strength of the components. The use of a plurality of epitaxial layers increases the distance, which is necessary for a higher dielectric strength, from the layers at the surface of the semiconductor component and thus prevents a breakdown at lower voltages. FIG. 1 illustrates two epitaxial layers 3 and 4 separated from one another by a broken line. Their thickness depends on the desired dielectric strength of the component.

A buried layer 5 is situated on the epitaxial layer 3 or 4 and is raised up to a surface 15 of the semiconductor. The buried layer 5 is n$^+$-doped and is thus more highly doped than the well 10. The buried layer 5 forms an edge layer of the well 10 at the surface 15 of the semiconductor and delimits the well with respect to the substrate at the bottom and with respect to an n-doped surface layer 11 at the surface 15 of the semiconductor. The surface layers 15, which are n-doped like the wells, are produced during the fabrication of the wells at the surface 15 of the semiconductor.

According to the invention, a side wall 6 is produced in the surface layer 11 and in the epitaxial layer or plurality of epitaxial layers 3 and 4 as part of an insulating well having the same conductivity type as the substrate 1. This is preferably carried out by diffusion, although production by implantation is possible. The doping of the side wall is preferably high, so that the region 6 in FIG. 1 and FIG. 2 is designated by reference symbol p+. The side wall 6 thus has a comparable doping to the p$^+$-type diffusion in the illustrated embodiment. The depth of the side wall 6 in the semiconductor depends on the distance between the p$^+$-type diffusion 2 and the surface 15 of the semiconductor, which is given by the desired dielectric strength of the component. In the case of a relatively low dielectric strength, that is to say up to approximately 30 V, a lower first insulator diffusion 7 in the vertically disposed p$^+$-type region 6 can be extended by further outdiffusion into the horizontally disposed p$^+$-type region 2. In the case of relatively high dielectric strengths, that is to say above approximately 60 V, a second masked insulator diffusion 8 must be provided between the first insulator diffusion 7 and a third insulator diffusion 9 at the surface 15, in order to ensure a necessary extent of the vertically disposed p$^+$-type side wall 6 as far as the p$^+$-type diffusion 2.

Thus, in the case of the semiconductor according to FIG. 1 with the epitaxial layers 3 and 4, a side wall 6 with three layers 7, 8 and 9 is necessary in order to establish the connection between the surface 15 and the p$^+$-type diffusion 2. The first insulator diffusion 7 is produced in conjunction with the first epitaxial layer 3, the second insulator diffusion 8 is produced in conjunction with the second epitaxial layer 4 and the third insulator diffusion 9 is produced in conjunction with the surface layer 11 during the fabrication of the wells 10. During the diffusion of the individual layers 7, 8, 9 of the side wall 6, boundaries of the individual layers in the side wall 6 are shifted, so that they are not illustrated at the same level as the adjacent layers.

The side wall 6 runs into the p$^+$-type diffusion 2, with the result that the wells 10 and their surroundings are hermetically shielded from one another and no parallel-path or cross current can be injected into the substrate 1 from one of these wells 10, nor can one of these wells 10 be interfered with by a parallel-path current in the substrate 1.

Thus, due to the doping conditions, in the case of the structure according to the invention, the current flowing in the event of negative potential at the first well will not flow away into the substrate but rather into the body region of the DMOS transistor, since there is a smaller pn threshold to overcome there than in the direction of the substrate.

Further charge carriers which pass into the p$^+$-type region 2 and/or 6 are dissipated to ground, as is illustrated in FIG. 1 and FIG. 2.

FIG. 2 shows a further embodiment of the structure according to the invention, which differs from the embodiment according to FIG. 1 by the fact that a (horizontal) p$^+$-type or p$^-$-type diffusion 2 is disposed only under the further n-type wells 10 which are jeopardized by parallel-path current. In contrast, in the case of the embodiment according to FIG. 1, the substrate 1 is covered over its entire area with a p$^+$-type diffusion. This structure according to FIG. 2 is achieved through the use of a masked diffusion of the horizontal p$^+$-type or p-type region 2. This makes it possible to protect just a few wells selectively against parallel-path currents in the substrate.

In this embodiment of the invention, it is not absolutely necessary for the diffusion 2 to be highly doped. It is advantageous, however, if the diffusion has a higher degree of doping than the p$^-$-type substrate. Due to the drift field between the p$^-$-type substrate 1 and the p-type region 2 under the n-type well 10, the p-type region 2 takes up far fewer minority carriers than without p-type diffusion.

Since, moreover, the wells 10 often only see small voltages, below approximately 20 V in multiple low-side switches, for example, the vertical extent of the p$^-$-type region 3 or regions 3 and 4 in FIG. 1 between the n$^+$-doped buried layer 5 and the horizontal p$^+$-type region 2 can be made very small or the p$^+$-type region can be dispensed with altogether. Therefore, the epitaxial layers 3 and 4 between the n$^+$-doped buried layer 5 and the p$^+$-type region 6, as were provided in the embodiment according to FIG. 1 for the purpose of producing a drift field for confining minority carriers to upper layers of the semiconductor, are no longer illustrated in the embodiment according to FIG. 2.

The other elements in FIG. 2 which have the same reference symbols as in FIG. 1 have the functions already explained in connection with the embodiment according to FIG. 1.

In order to complete the power IC, that is to say in order to fabricate the structures of the DMOS transistors in the individual wells 10, the above-mentioned steps of the method according to the invention may subsequently be followed by performance of a corresponding standard BCD process (Bipolar/CMOS/DMOS technology) beginning with lower insulation diffusion or the buried layer diffusion.

The invention thus provides a device which avoids parallel-path or cross currents in a reliable manner and at low cost.

I claim:

1. A semiconductor component, comprising:
   a substrate having a first conductivity type and a surface;
   a plurality of separate wells of a second conductivity type with a more highly doped edge layer of the second conductivity type disposed at said surface of said substrate and isolated from one other by pn junctions;
   an shielding well of the first conductivity type completely surrounding at least one of said separate wells and having a higher doping than said substrate;
   a substrate supplementary layer on said substrate;
   a side wall between said substrate supplementary layer and said surface of said substrate; and
   a spacer layer of the first conductivity type disposed between said substrate supplementary layer and said edge layer, said spacer layer being more weakly doped than said substrate supplementary layer and said side wall of said shielding well.

2. The semiconductor component according to claim 1, wherein said spacer layer includes two partial layers.

3. A method for fabricating a semiconductor component, which comprises:
   providing a substrate having a first conductivity type and a surface;
   producing a plurality of separate wells at the surface of the substrate, the separate wells having a second conductivity type and a more highly doped edge layer of the second conductivity type;
   producing connection and control electrodes in the separate wells for fabricating component structures;
   producing an shielding well around at least one of the separate wells, the shielding well having the first conductivity type and a doping higher than the substrate; and
   producing a spacer layer of the first conductivity type between the shielding well and the edge layer, the spacer layer being more weakly doped than the shielding well.

4. The method according to claim 3, which comprises carrying out the step of producing the shielding well by producing a substrate supplementary layer on the substrate and producing a vertical side wall contiguous with the substrate supplementary layer between the separate wells.

5. A semiconductor component, comprising:
   a substrate having a first conductivity type and a surface;
   a plurality of separate wells of a second conductivity type with a more highly doped edge layer of the second conductivity type disposed at said surface of said substrate and isolated from one other by pn junctions;
   an shielding well of the first conductivity type completely surrounding at least one of said separate wells and having a higher doping than said substrate; and
   a spacer layer of the first conductivity type located between said shielding well and said at least one of said plurality of separate wells, said spacer layer having a lower doping than said shielding well.

* * * * *

UNITED STATES PATENT AND TRADEMARK OFFICE
CERTIFICATE OF CORRECTION

PATENT NO. : 6,469,365 B1  Page 1 of 1
DATED : October 22, 2002
INVENTOR(S) : Wolfgang Werner It is certified that error appears in the above-identified patent and that said Letters Patent is hereby corrected as shown below:

<u>Title page,</u>
Item [30] should read as follows"

-- Feb. 12, 1998 (DE) .......... 198 05 786.5 --

Signed and Sealed this

Twenty-fifth Day of February, 2003

JAMES E. ROGAN
*Director of the United States Patent and Trademark Office*